(12) United States Patent
Goetzenberger

(10) Patent No.: US 9,780,058 B2
(45) Date of Patent: Oct. 3, 2017

(54) ASSEMBLY WITH A CARRIER SUBSTRATE AND AT LEAST ONE ELECTRICAL COMPONENT ARRANGED THEREON, AND ELECTRICAL COMPONENT

(71) Applicant: CONTINENTAL AUTOMOTIVE GMBH, Hannover (DE)

(72) Inventor: Martin Goetzenberger, Ingolstadt (DE)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 15/137,143

(22) Filed: Apr. 25, 2016

(65) Prior Publication Data
US 2016/0315062 A1 Oct. 27, 2016

(30) Foreign Application Priority Data

Apr. 24, 2015 (DE) .................. 10 2015 207 541

(51) Int. Cl.
*H01L 23/48* (2006.01)
*H01L 23/00* (2006.01)
*H01L 23/498* (2006.01)

(52) U.S. Cl.
CPC ........ *H01L 24/17* (2013.01); *H01L 23/49827* (2013.01); *H01L 23/49838* (2013.01); *H01L 2224/16055* (2013.01); *H01L 2224/16057* (2013.01); *H01L 2224/16227* (2013.01); *H01L 2224/16235* (2013.01); *H01L 2224/16237* (2013.01); *H01L 2224/1703* (2013.01)

(58) Field of Classification Search
CPC . H01L 2224/16057; H01L 2224/16055; H01L 2224/16227; H01L 2224/16237; H01L 2224/16235; H01L 2224/1703; H01L 23/49838; H01L 23/49827; H01L 24/17
See application file for complete search history.

(56) References Cited

U.S. PATENT DOCUMENTS

2016/0268189 A1* 9/2016 Mikado ............ H01L 23/49838

FOREIGN PATENT DOCUMENTS

DE 102004044603 A1 3/2006

\* cited by examiner

*Primary Examiner* — (Vikki) Hoa B Trinh
(74) *Attorney, Agent, or Firm* — Laurence A. Greenberg; Werner H. Stemer; Ralph E. Locher

(57) ABSTRACT

An electronic assembly has a carrier substrate with contact surfaces and at least one electrical component on the carrier substrate. On its surface that is oriented toward the carrier substrate, the component has a number of contacting solder balls, which are respectively connected to a contact surface assigned to them. On the surface of the electrical component that is oriented toward the carrier substrate there is also arranged at least one fixing solder ball, which has a greater diameter than the contacting solder balls. The carrier substrate has at the location at which the at least one fixing solder ball is in contact with the carrier substrate a depression, in which the fixing solder ball is placed.

6 Claims, 1 Drawing Sheet

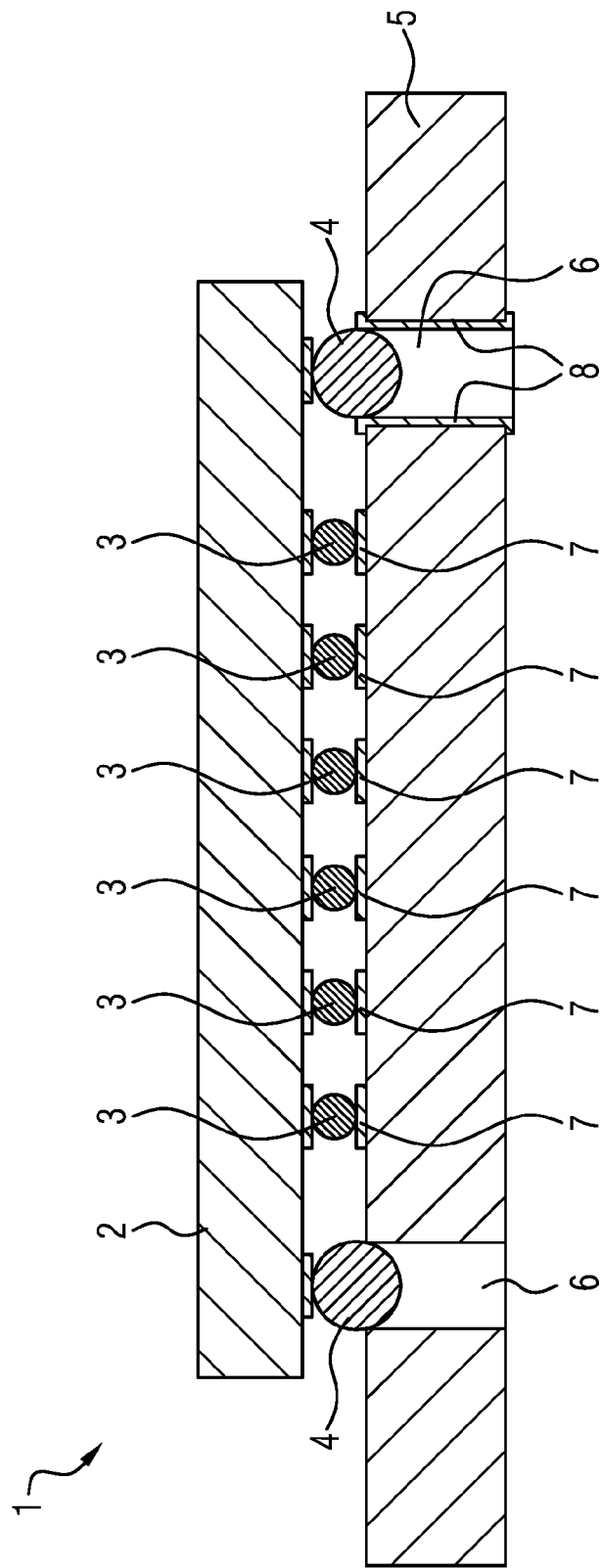

ASSEMBLY WITH A CARRIER SUBSTRATE AND AT LEAST ONE ELECTRICAL COMPONENT ARRANGED THEREON, AND ELECTRICAL COMPONENT

CROSS-REFERENCE TO RELATED APPLICATION

This application claims the priority, under 35 U.S.C. §119, of German application DE 10 2015 207 541.9, filed Apr. 24, 2015; the prior application is herewith incorporated by reference in its entirety.

BACKGROUND OF THE INVENTION

Field of the Invention

The invention relates to an arrangement with a carrier substrate having contact areas and at least one electrical component arranged thereon, which has on its surface oriented toward the carrier substrate a number of contacting solder balls, which are respectively connected to a contact area assigned to them.

The invention also relates to an electrical component with a number of solder balls arranged on one of its surfaces.

Such an arrangement and such an electrical component are known from German published patent application DE 10 2004 044 603 A1. The electrical component there is formed as a surface-mountable semiconductor component, the solder balls of which are arranged as a ball grid array (BGA). In principle, however, all surface-mountable electrical and electronic components are to be understood as within the scope of the invention. During mounting, they are usually placed on the surfaces of carrier substrates, which may be realized for example as printed circuit boards, such that the solder balls come into contact with contact areas on the carrier substrate that are to be connected to them and they enter into a connection with the contact areas during the melting of the solder balls, for example in an oven.

The carrier substrates with the electrical components placed thereon are usually transported on a conveyor belt to a soldering oven or a corresponding device for the melting of the solder balls. However, when such conveyor belts with carrier substrates with electrical components placed thereon start up, there is the problem that particularly relatively large and heavy components, which are not yet mechanically connected to the carrier substrates, experience such a jolt that the solder balls slip on the contact areas of the carrier substrate and only an inferior contact or no contact at all is produced when the solder balls melt, or the solder balls are even connected to an incorrect contact area.

SUMMARY OF THE INVENTION

It is accordingly an object of the invention to provide a method and a component which overcome the above-mentioned and other disadvantages of the heretofore-known devices and methods of this general type and which ensure the adequate fixing of the electrical component on the carrier substrate during the mounting process.

With the foregoing and other objects in view there is provided, in accordance with the invention, an assembly, comprising:

a carrier substrate formed with contact surfaces;

at least one electrical component arranged on said carrier substrate, said at least one electrical component having a facing surface oriented toward said carrier substrate and a plurality of contacting solder balls disposed on said facing surface and connected to respective said contact areas assigned thereto;

at least one fixing solder ball arranged on said facing surface of said electrical component that is oriented toward said carrier substrate, said at least one fixing solder ball having a greater diameter than said contacting solder balls; and said carrier substrate, at a location at which said at least one fixing solder ball is in contact with said carrier substrate, being formed with a depression formed to receive said at least one fixing solder ball.

In other words, the objects of the invention are achieved by an assembly of the generic type in which there is arranged on the surface of the electrical component that is oriented toward the carrier substrate at least one fixing solder ball, which has a greater diameter than the contacting solder balls, and in which the carrier substrate has at the location at which the at least one fixing solder ball is in contact with the carrier substrate a depression, in which the fixing solder ball is placed.

The object is also achieved by an electrical component of the generic type in the case of which there is arranged on its surface that is oriented toward the carrier substrate at least one fixing solder ball, which has a greater diameter than the contacting solder balls.

As a result of the different sizes of the contacting solder balls and the at least one fixing solder ball, in the non-melted state of the solder balls the fixing solder ball lies stably in the depression of the carrier substrate, so that the electrical component cannot slip on the carrier substrate when the carrier substrate is for example moved in a jolting manner by means of a carrier belt.

In an advantageous development of the arrangement according to the invention, fixing solder balls that have a greater diameter than the contacting solder balls are arranged at least at two locations in the peripheral region of the electrical component, the carrier substrate having depressions in which the fixing solder balls are placed at the locations at which the fixing solder balls are in contact with the carrier substrate.

As a result, this has the effect of also preventing the component from being able to turn, if only one fixing solder ball is used.

In the case of an advantageously developed electrical component, fixing solder balls that have a greater diameter than the contacting solder balls are arranged at least at three locations in the peripheral region of the electrical component.

In a further advantageous development of the invention, the depressions in the carrier substrate are formed as through-holes, and can consequently be produced in a single operation with further through-holes that are possibly present.

The fixing solder balls may serve solely for mechanical fixing, but they may also accomplish an electrical contact of the electrical component with contact areas of the carrier substrate. For this purpose, the wall of a through-hole may advantageously be metallized.

Other features which are considered as characteristic for the invention are set forth in the appended claims.

Although the invention is illustrated and described herein as embodied in an arrangement with a carrier substrate and at least one electrical component arranged thereon, and electrical component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing FIGURE.

BRIEF DESCRIPTION OF THE DRAWING

The FIGURE shows an arrangement according to the invention with a carrier substrate and an electrical component arranged thereon.

DETAILED DESCRIPTION OF THE INVENTION

Referring now to the sole FIGURE of the drawing in detail, there is shown an electrical component 1 in the form of an integrated semiconductor circuit. The semiconductor chip of the electrical component is arranged in a housing 2. The housing 2 is provided with contacting solder balls 3, which are formed in a ball grid array, and with fixing solder balls 4 in its peripheral region. The contacting solder balls 3 are disposed on a facing surface of the electrical component/housing which is oriented toward the carrier substrate 5. In order to place the electrical component 1 stably on a carrier substrate 5, without it being able to turn, at least two fixing solder balls 4 are required, but there may also be more. If there is no risk of turning, a single fixing solder ball 4 is also sufficient.

The carrier substrate 5 is formed with contact surfaces 7 and with depressions 6. In the exemplary embodiment illustrated in the FIGURE, the depressions 6 are formed as through-holes in the carrier substrate 5. One of the through-holes has a metallization 8 of its wall. The fixing solder balls 4 and the depressions 6 are chosen in terms of their diameters such that the fixing solder balls 4 come to lie in the depressions 6, so that the electrical component 1 cannot be made to slip by the starting jolt during acceleration of the carrier substrate 5, for example when a transport belt starts up. In addition, the placement of the solder balls 4 in combination with the depressions 6 is chosen such that the accurate alignment of the contacting solder balls 3 with contact surfaces 7, or contact areas, on the carrier substrate is ensured.

The arrangement and the component can be produced very easily, since it is possible with the customary production methods, both of the carrier substrate 5 and of the electrical component 1, to provide both the fixing solder balls 4 and the depressions 6 in an easy way. No additional process steps are required and there is also no requirement for additional materials that are customary in the production of such arrangements of electrical components on carrier substrates.

The invention claimed is:

1. An assembly, comprising: a carrier substrate formed with contact surfaces; at least one electrical component arranged on said carrier substrate, said at least one electrical component having a planar facing surface oriented toward said carrier substrate and formed with other contact surfaces; a plurality of contacting solder balls directly attached to respective said other contact surfaces disposed on said facing surface and directly connected to respective said contact surfaces on said substrate assigned thereto at least one fixing solder ball arranged on said facing surface of said electrical component that is oriented toward said carrier substrate, said at least one fixing solder ball having a greater diameter than said contacting solder balls and being disposed to fix a relative position between said carrier substrate and said electrical component and to prevent displacement of said electrical component relative to said carrier substrate prior to soldering; and said carrier substrate, at a location at which said at least one fixing solder ball is in contact with said carrier substrate, being formed with a depression formed to receive said at least one fixing solder ball.

2. The assembly according to claim 1, wherein said at least one fixing solder ball is one of at least two fixing solder balls having a greater diameter than said contacting solder balls and being arranged at least at two locations in the peripheral region of said electrical component, and said carrier substrate is formed with depressions in which said fixing solder balls are placed at the locations at which said fixing solder balls are in contact with said carrier substrate.

3. The assembly according to claim 2, wherein said depressions are through-holes extending through said carrier substrate.

4. The assembly according to claim 3, wherein a wall of at least of one of said through-holes is metallized.

5. The assembly according to claim 1, wherein said depression is a through-hole extending through said carrier substrate.

6. The assembly according to claim 5, wherein a wall of said through-hole is metallized.

* * * * *